(12) United States Patent
Lehmann et al.

(10) Patent No.: US 6,549,063 B1
(45) Date of Patent: Apr. 15, 2003

(54) EVALUATION CIRCUIT FOR AN ANTI-FUSE

(75) Inventors: Gunther Lehmann, Poughkeepsie, NY (US); Ulrich Frey, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/044,470

(22) Filed: Jan. 11, 2002

(51) Int. Cl.⁷ .............................................. H01H 37/76
(52) U.S. Cl. ...................................................... 327/525
(58) Field of Search ....................... 327/525; 365/225.7, 365/96

(56) References Cited

U.S. PATENT DOCUMENTS

| | | | |
|---|---|---|---|
| 5,706,238 A | 1/1998 | Cutter et al. ............. | 365/225.7 |
| 5,774,011 A * | 6/1998 | Au et al. ..................... | 327/525 |
| 5,801,574 A | 9/1998 | Martin et al. ............... | 327/525 |
| 5,831,923 A | 11/1998 | Casper ..................... | 365/225.7 |
| 6,108,261 A | 8/2000 | Kim et al. ................. | 365/225.7 |
| 6,181,627 B1 * | 1/2001 | Casper et al. ............. | 365/225.7 |
| 6,307,423 B1 * | 10/2001 | Morton ........................ | 327/525 |
| 6,384,666 B1 * | 5/2002 | Bertin et al. ................ | 327/525 |
| 6,426,668 B1 * | 7/2002 | Morrish et al. ............. | 327/525 |

* cited by examiner

Primary Examiner—Timothy P. Callahan
Assistant Examiner—Terry L. Englund
(74) Attorney, Agent, or Firm—Jackson Walker L.L.P.

(57) ABSTRACT

The present invention provides for evaluating a programmable anti-fuse element. For a programmable transistor anti-fuse, the gate of the anti-fuse is precharged with a predetermined voltage and/or current and the anti-fuse is subsequently evaluated. In one embodiment a precharge voltage sufficient to turn ON a transistor is provided to the gate. Here, an intact (unblown) transistor remains ON over a period of time and a damaged (blown) transistor dissipates the charge voltage and turns OFF. The status of the transistor is subsequently determined by evaluating the resistance between the drain and source. A high resistance indicates a blown condition and a low resistance indicates an unblown condition. In another embodiment, a small current is provided to the gate in which the small current is greater than a leakage current for an intact transistor and is less than a leakage current for a damaged transistor. An intact transistor charges to an ON state over a period of time but a damaged transistor does not because it's leakage current is greater than the small current provided to the gate. Again, the status of the transistor anti-fuse is subsequently determined by evaluating the resistance between the drain and source.

20 Claims, 3 Drawing Sheets

EVALUATION CIRCUIT FOR AN ANTI-FUSE

BACKGROUND OF THE INVENTION

1. Technical Field of the Invention

The present invention relates generally to the field of integrated circuits and, more particularly, to evaluating a state condition of an anti-fuse.

2. Description of the Related Art

Integrated circuits often require programmable electrical connections between circuit nodes. Such connections can be implemented by use of an anti-fuse link. Anti-fuses are fabricated with a structure similar to that of a capacitor in which two conductive electrical terminals are separated by a insulating layer, like silicon oxide. In an "off" state, the antifuse has a high resistance between its terminals. The anti-fuse can be programmed to an "on" state (i.e., a low resistance) by breaking down the interposed layer to form a conductive link between the anti-fuse terminals.

Electrical anti-fuses have been introduced into semiconductor products and are, in many applications, replacing the commonly used laser fuses. One of the currently applied anti-fuse types is a structure based on a conventional MOS transistor. Such an anti-fuse is blown by applying a blow voltage (generally about 7 Volts) across the gate-oxide of the MOS transistor. The blow process results in a damaged gate-oxide which reduces the electrical resistance across the oxide. An evaluation circuit attached to the anti-fuse must be able to differentiate between the high resistance of the intact oxide ($R_{off}$) and the lowered resistance of the damaged oxide ($R_{on}$).

Typical values for $R_{off}$ are in the range of $10^{12}$ ohms. The range of $R_{on}$ largely depends on the parameters during the blow process. High blow voltage and high blow current generally lead to lower $R_{on}$ resistances. However, it is desired to minimize those two parameters in order to reduce the size of the associated circuits (e.g. blow voltage generator, blow transistor, wiring, etc.). From that perspective, practical values of $R_{on}$ are in the range of $10^5$ ohms to $10^8$ ohms. Fuse evaluation circuits commonly used for laser fuses and electrical fuses are not be able to accurately distinguish an unblown anti-fuse and a blown anti-fuse exhibiting the relatively high practical $R_{on}$ values.

Therefore, there is a need for a method and circuit for evaluating the state of a MOS transistor anti-fuse, including a blown anti-fuse exhibiting a relatively high gate oxide resistance.

SUMMARY OF THE INVENTION

The present invention achieves technical advantages as an apparatus, system and method of evaluating a programmable anti-fuse element. For a programmable transistor antifuse element, the gate of the anti-fuse is precharged with a predetermined voltage and/or current and the anti-fuse is subsequently evaluated. In one embodiment, a precharge sufficient to provide an operating threshold voltage is applied to the gate. Here, an intact (unblown) transistor remains ON over a period of time and a damaged (blown) transistor dissipates the ON voltage and turns OFF. The status of the transistor is subsequently determined by evaluating the resistance between the drain and source. A high resistance indicates a blown condition and a low resistance indicates an unblown condition. In another embodiment, a small current is provided to the gate in which the small current is greater than a leakage current for an intact transistor and is less than a leakage current for a damaged transistor. An intact transistor charges to an ON state over a period of time but a damaged transistor does not because it's leakage current is greater than the small current provided to the gate. Again, the status of the transistor is subsequently determined by evaluating the resistance between the drain and source.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

One aspect of the present invention advantageously utilizes the amplifying characteristics of a MOS transistor to assist in detection of the state of the MOS transistor's gate-oxide (which gate-oxide functions as the anti-fuse), particularly following the application of a blow process. Only a very small current is needed to control the gate-source voltage of the anti-fuse transistor, since the leakage current across an intact gate-oxide is in the order of 1pA. However, a change in the gate-source voltage (e.g. from 0V to 2V) significantly changes the drain-source resistance. This resistance change can be detected with an evaluation circuit herein described. As a result, in accordance with an aspect of the present invention, a relatively high gate-oxide resistance, in the order of $10^8$ ohms, can be accurately interpreted as a blown anti-fuse. Thus, assets associated with blowing the anti-fuse 200 can be advantageously reduced and/or minimized.

Figure 1:
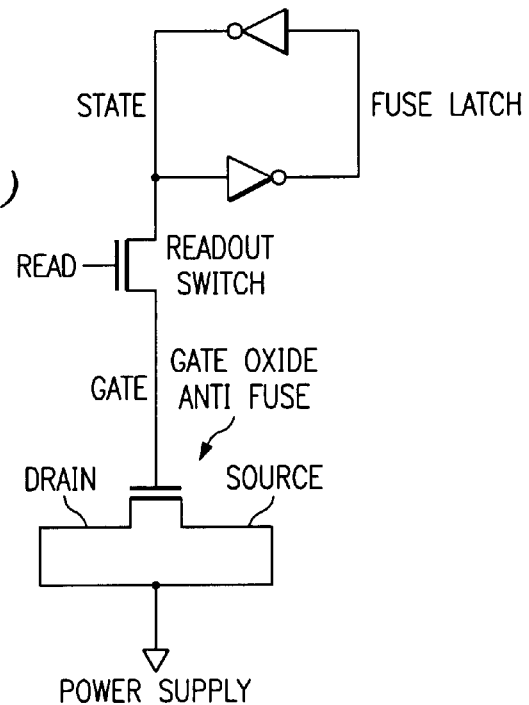
FIG. 1 illustrates a schematic diagram of an anti-fuse read circuit.

Some commonly used anti-fuse evaluation circuits are shown and described in U.S. Pat. Nos. 5,706,238, 5,801,574, and 5,831,923. All three patents evaluate the state of the anti-fuse by connecting a sensing circuit to one terminal of the anti-fuse while the other terminal of the anti-fuse is connected to a power supply line. Therefore, the resistance of the insulator material is used as an immediate indicator of the state of the anti-fuse. Applying these patents to a MOS transistor gate-oxide anti-fuse would require the drain and source node of the transistor be connected together forming one terminal whereas the gate of the transistor anti-fuse would form a second terminal. The state of the anti-fuse would then be determined by the resistance between those two terminals, resembling the resistance of the insulator material. FIG. 1 depicts the essentials of this configuration combined with a pair of cross coupled inverters as a sensing circuit (fuse latch). As shown in this figure, the state of the anti-fuse (blown vs. unblown) is evaluated by the fuse latch when the readout switch is closed (conducting). The fuse latch flips into a high or low state depending on the resistance of the gate-oxide of the MOS transistor anti-fuse.

In the configuration of FIG. 1, the amplifying function of the MOS transistor of the anti-fuse is not being used, since the resistance of the insulator material is measured directly by the connected sensing circuit. However, as outlined above, $R_{on}$ of the insulator material can be so high that this approach is not able to consistently indicate the fuse status accurately.

Figure 2:
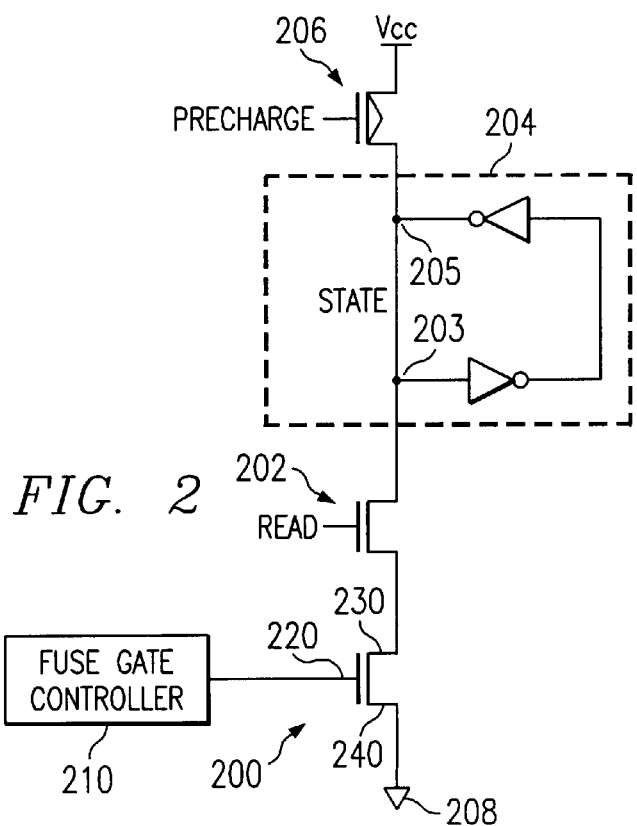
FIG. 2 illustrates a schematic diagram of an anti-fuse evaluation circuit in accordance with an exemplary embodiment of the present invention.

Referring now to FIG. 2 there is illustrated a schematic diagram of an anti-fuse evaluation circuit in accordance with an exemplary embodiment of the present invention. A readout switch 202, such as an NMOS transistor, couples to the drain of the anti-fuse 200 and to a fuse latch 204 at node 203. The fuse latch 204 is adapted to stabilize an output value or state (blown vs. unblown) of the anti-fuse 200 and, in at least one embodiment, includes a pair of cross-coupled inverters. A gate 220 of the anti-fuse 200 is coupled to a control device 210 adapted to control the anti-fuse via the gate 220. A source 240 of the anti-fuse 200 is connected to the power supply (e.g. ground 208). The state of the anti-fuse 200 is determined by the fuse latch 204 when the readout switch 202 is closed (conducting). The fuse latch 204 flips into a high or low state depending on the conductivity of the drain-source connection of the MOS transistor anti-fuse 200. Also, a switch 206 adapted to precharge the fuse latch 204 with a power supply voltage Vcc in response to an input signal (PRECHARGE), is coupled to the fuse latch 204 at node 205. A PRECHARGE signal couples Vcc to the fuse latch, which is precharged to a known (high) state.

A fuse gate controller 210 is coupled to a gate 220 of the anti-fuse 200 and is adapted to apply a precharge voltage and/or current to the gate 220. The precharge presets the gate such that the state of the gate-oxide (damaged vs. intact) can subsequently be determined by the drain-source resistance of the anti-fuse transistor. A low resistance between the drain 230 and the source 240 indicates the anti-fuse 200 is intact (unblown), a high resistance indicates the anti-fuse 200 has been blown.

Figure 3A:
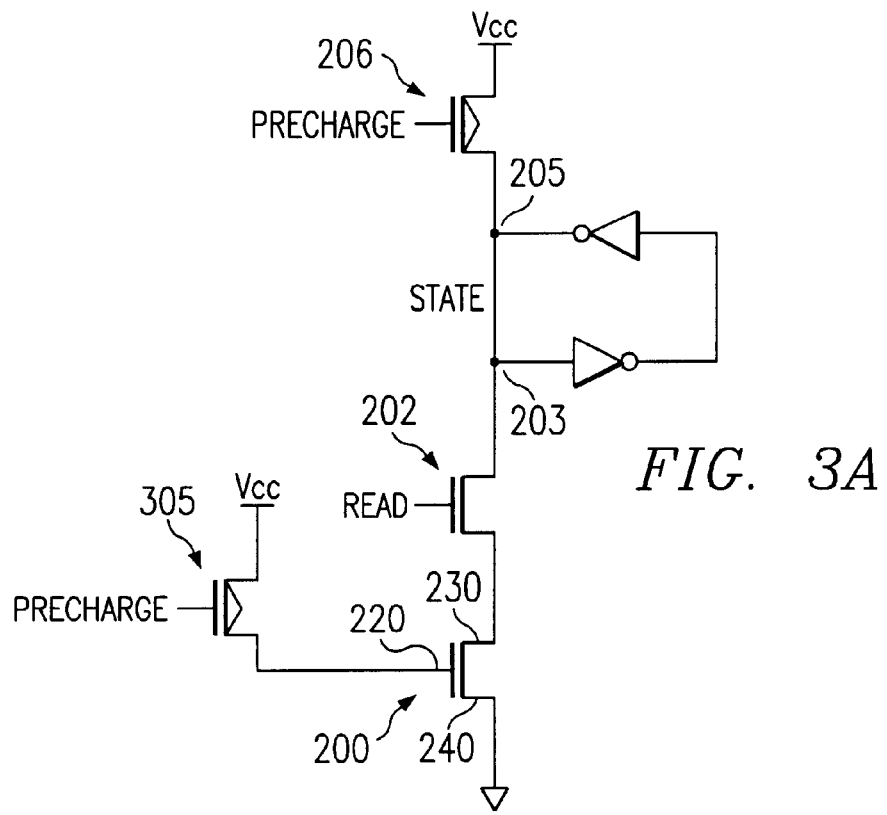
FIG. 3A illustrates an alternative embodiment of the anti-fuse evaluation circuit and, more particularly, the control device 210 illustrated in FIG. 2.

Referring now to FIG. 3A there is illustrated an alternative embodiment of the anti-fuse evaluation circuit and, more particularly, the fuse gate controller 210 illustrated in FIG. 2. Here, the fuse gate controller 210 includes a switch 305, such as a PMOS transistor, for connecting the gate 220 of the anti-fuse 200 to a power supply node (Vcc) during an initial precharge phase to provide an operating threshold voltage. With the gate node 220 being precharged, the anti-fuse transistor 200 exhibits a low drain-source resistance, however, if the gate-oxide was damaged during a fuse blow operation, the charge on the gate 220 will diminish over a period of time and the transistor will turn OFF, subsequently exhibiting a high drain-source resistance.

Figure 3B:
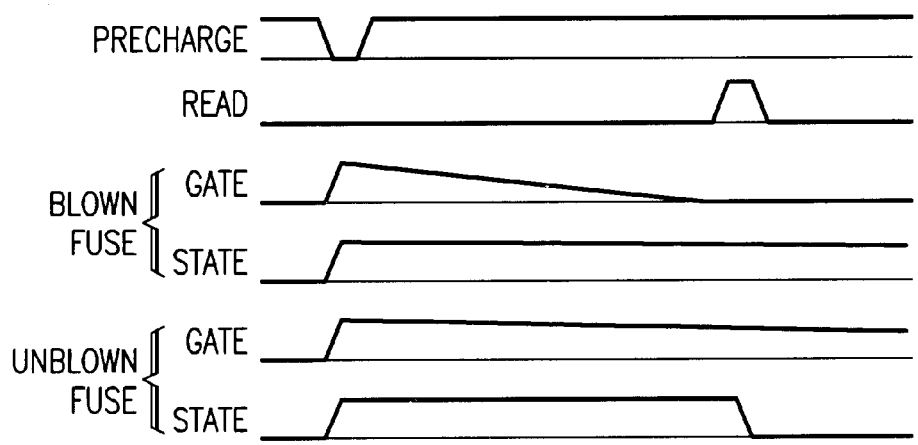
FIG. 3B illustrates a timing diagram showing the timing relationships corresponding to the anti-fuse evaluation circuit illustrated in FIG. 3A.

Referring now to FIG. 3B there is illustrated a timing diagram showing the timing relationships corresponding to the anti-fuse evaluation circuit illustrated in FIG. 3A. The STATE signal indicates the state of the anti-fuse 200 in which a low signal (i.e., low drain-source resistance) represents an unblown fuse and a high signal (i.e., high drain-source resistance) represents a blown fuse. Subsequent to a precharge phase, the signal on the gate node 220 (GATE) increases to a level approximately equal to Vcc and the transistor turns ON. If the gate-oxide of the anti-fuse 200 is not damaged, the GATE signal stays at a voltage around Vcc, so the anti-fuse transistor 200 remains ON and results in the indication of a low drain-source resistance or unblown fuse at read-out (i.e. STATE goes low). If the gate-oxide is damaged, from a fuse blow operation, the GATE signal diminishes and the anti-fuse transistor 200 turns OFF resulting in the indication of a high drain-source resistance or blown fuse at read-out (i.e. STATE remains high).

Figure 4A:
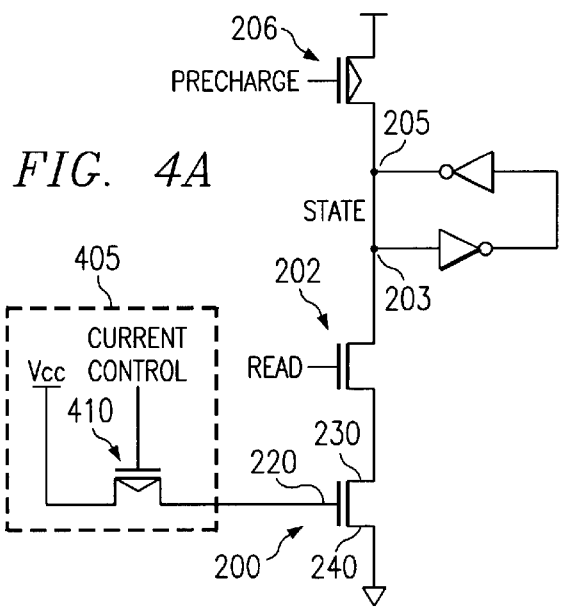
FIG. 4A illustrates an alternative embodiment of the anti-fuse evaluation circuit and, more particularly, the control device 210 illustrated in FIG. 2.

Referring now to FIG. 4A there is illustrated an alternative embodiment of the anti-fuse evaluation circuit and, more particularly, the fuse gate controller 210 illustrated in FIG. 2. Here, the fuse gate controller 210 is a bleeder circuit 405 which is coupled to the gate 220 of anti-fuse 200 and is configured to provide a very small current to the gate 220. More specifically, the bleeder circuit 405 is adapted to provide a current of less than the typical leakage current through a blown gate-oxide and higher than the typical leakage current through an intact gate-oxide (e.g. in the order of 100 pA). If the gate 220 is intact (unblown fuse), the gate 220 charges up to the operating threshold of the anti-fuse transistor 200 and turns ON over a period of time corresponding to the bleeder circuit applied current, and the drain-source resistance drops as the transistor 200 is in turned ON. On the other hand, if the anti-fuse 200 has been blown, the gate 220 cannot be charged by the applied current since it is less than the leakage current and, thus, the transistor anti-fuse 200 does not turn ON, which results in a high drain-source resistance.

The MOS transistor 410 illustrates a specific implementation of the bleeder circuit 405. With the MOS transistor 410, the current results from the subthreshold drain-source current of the MOS transistor 410. This subthreshold current is well suited since it is significantly higher than the typical leakage current through an intact gate-oxide and is also significantly lower than a typical leakage current through a blown gate-oxide. Also, as shown in FIG. 4A, the gate of the MOS transistor 410 can be connected to an input signal (CURRENT CONTROL) instead of tying it to a constant power supply voltage. The input signal then can be used to control the subthreshold leakage. This enables the current applied to the gate 220 to be adjusted higher or lower to effectively move the trip point for a blown versus unblown indication. A lower adjusted applied gate current will cause an indication of a blown status for higher gate-oxide resistances. Therefore, the input signal provides a method to set the resistance value which separates a blown from an unblown anti-fuse. If more than one anti-fuse circuit exists on a semiconductor chip, the input signal beneficially allows to adjust the trip point of all anti-fuse circuits simultaneously without changing the implementation of the circuits themselves.

Figure 4B:
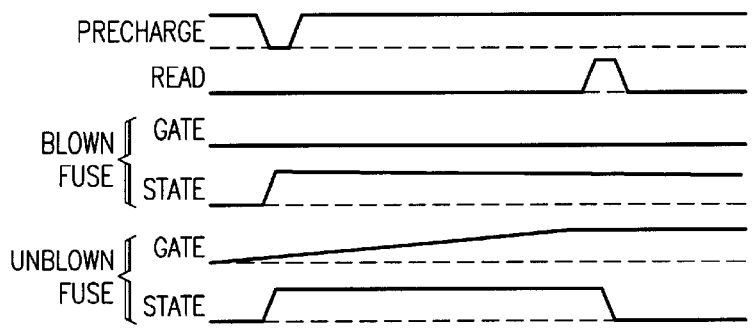
FIG. 4B illustrates a timing diagram showing the timing relationships corresponding to the anti-fuse evaluation circuit illustrated in FIG. 4A.

FIG. 4B illustrates a timing diagram showing the timing relationships corresponding to the anti-fuse evaluation circuit illustrated in FIG. 4A. The STATE signal indicates the state of the anti-fuse 200 in which a low signal (i.e., low drain-source resistance) represents an unblown fuse and a high signal (i.e., high drain-source resistance) represents a blown fuse. For an unblown fuse, with the small bleeder circuit current, the GATE signal gradually increases up to the operating threshold and the drain-source resistance of the transistor anti-fuse 200 drops as the transistor turns ON, resulting in a low STATE signal at read-out. If the anti-fuse 200 has been blown, the GATE signal on node 220 remains low because the bleeder circuit current is lower than the leakage current and, thus, the transistor anti-fuse 200 does not turn ON, which results in a high STATE signal during read-out.

Further, the trip point, which defines the separation between a blown and an unblown fuse, can also be adjusted by the timing of the READ signal (as shown in FIG. 3B). When the READ pulse is applied later in time, a blown fuse has more time to discharge the gate node 220. Therefore, even a relatively high resistance across the gate oxide of anti-fuse 200 will be indicated as a blown anti-fuse, since the gate 220 has been discharged and the transistor 200 is OFF. However, if the READ pulse is applied earlier in time, a blown fuse has less time to discharge the gate 220, translating into to a relatively low trip point resistance. Therefore, the trip point of the anti-fuse circuit can be adjusted by modifying the timing of the READ pulse. Similar to the input signal CURRENT CONTROL described earlier, this behavior is beneficial since it allows to adjust the trip point of the anti-fuse circuit without changing its implementation.

Figure 5:
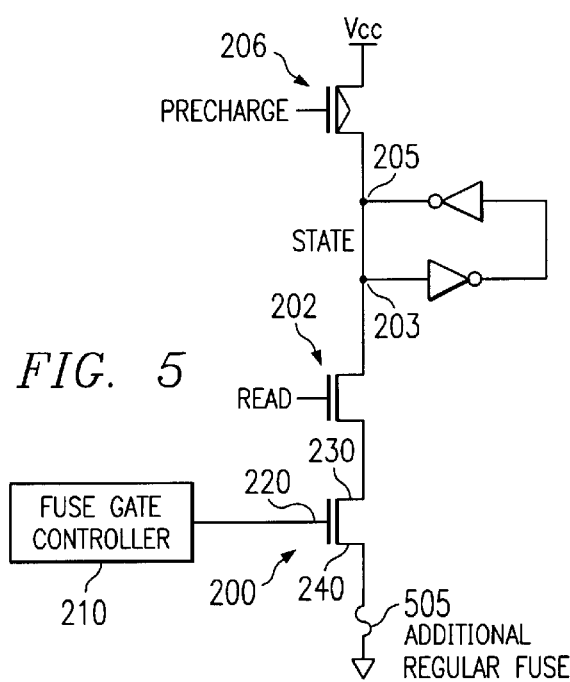
FIG. 5 illustrates a schematic diagram of an anti-fuse evaluation circuit in accordance with an alternative embodiment of the present invention.

Referring now to FIG. 5 there is illustrated a schematic diagram of an alternative anti-fuse evaluation circuit in accordance with an exemplary embodiment of the present invention. Conventionally, the application of an anti-fuse means that a blown fuse is detected by a low fuse resistance. However, this behavior makes it difficult to combine an anti-fuse with a regular fuse (e.g. a laser fuse, fuse link, or similar fuse used in the art) since those fuses exhibit the opposite behavior, i.e. a blown fuse is detected by its high resistance. in accordance with an embodiment of the present invention, the logic of the anti-fuse is reversed. As described herein, a blown fuse is represented by a high drain-source resistance which means the present logic of the anti-fuse behaves identical to a regular fuse (blown=high resistance). With this identical detection logic, advantageous sharing of evaluation circuit assets for different fuse types can be achieved. As shown in FIG. 5, in addition to the anti-fuse 200, a regular fuse 505 is serially connected to the source 240 of the gate-oxide anti-fuse 200. Here, the evaluation circuit indicates a blown fuse when at least one of the anti-fuse 200 and the regular fuse 505 fuse exhibits a high resistance.

Although a preferred embodiment of the apparatus, system, and method of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An apparatus for evaluating a gate oxide anti-fuse provided by a MOS transistor, comprising:
   an output for providing a control signal to a gate of said MOS transistor;
   an input for receiving from said MOS transistor a further signal indicative of a resistance that occurs between a source and a drain of said MOS transistor in response to said control signal; and
   circuitry coupled to said input and responsive to said further signal indicating a first resistance for determining that said anti-fuse is blown, and responsive to said further signal indicating a second resistance for determining that said anti-fuse is not blown, wherein said first resistance is greater than said second resistance.

2. The apparatus of claim 1 further comprising a current supply coupled to said output and operable to provide a current sufficient to charge said MOS transistor to an operating threshold.

3. The apparatus of claim 2, wherein said further signal is responsive to a read signal applied following a period of time subsequent to application of said charge current.

4. The apparatus of claim 2, wherein said current is greater than a leakage current of an intact MOS transistor and less than a leakage current of a damaged MOS transistor.

5. The apparatus of claim 2, wherein said current is approximately a subthreshold drain-source current of a MOS transistor.

6. The apparatus of claim 1 further comprising a switch coupling said output and a power supply and operable to provide said control signal as an operating threshold voltage of a MOS transistor.

7. The apparatus of claim 1 further comprising a switch coupling said output and a power supply and operable to provide said control signal as a variable current to said MOS transistor gate.

8. An anti-fuse apparatus, comprising:
   a MOS transistor having a gate, a source and a drain, wherein said MOS transistor provides a gate oxide anti-fuse;
   an input coupled to said gate for receiving from an anti-fuse evaluator a control signal for said gate; and
   an output coupled to one of said source and said drain for providing to said anti-fuse evaluator a further signal indicative of a resistance that occurs between said source and said drain in response to said control signal, wherein said further signal indicates a first resistance if said anti-fuse is blown and a second resistance if said anti-fuse is not blown, and wherein said first resistance is greater than said second resistance.

9. The apparatus of claim 8, wherein said control signal is a current sufficient to charge said MOS transistor to an operating threshold over a period of time.

10. The apparatus of claim 9, wherein said current is greater than a leakage current of an intact MOS transistor and less than a leakage current of a damaged MOS transistor.

11. The apparatus of claim 9, wherein said current is approximately a subthreshold drain-source current of a MOS transistor.

12. The apparatus of claim 8, wherein said control signal is an operating threshold voltage of a MOS transistor.

13. The apparatus of claim 8 further comprising a programmable fuse element coupled in series with said drain and said source.

14. The apparatus of claim 8 further including a read circuit coupled to said output and operable to apply a read signal following a period of time subsequent to receiving said control signal.

15. A method of operating an anti-fuse, comprising:
   using a MOS transistor to provide a gate oxide anti-fuse;
   applying a control signal to a gate of said MOS transistor; and
   determining a resistance that occurs between a source and a drain of said MOS transistor in response to application of said control signal, wherein a first resistance indicates that said anti-fuse is blown and a second resistance indicates that said anti-fuse is not blown, and wherein said first resistance is greater than said second resistance.

16. The method of claim 15, wherein said control signal is a current sufficient to charge said MOS transistor to an operating threshold.

17. The method of claim 16, wherein said current is greater than a leakage current for an intact MOS transistor and less than a leakage current for a damaged MOS transistor.

18. The method of claim 16, wherein said current is approximately a subthreshold drain-source current of a MOS transistor.

19. The method of claim 15, wherein said control signal is an operating threshold voltage of a MOS transistor.

20. The method of claim 15, wherein said determining step includes determining said resistance only if a programmable fuse element coupled in series with said drain and said source is not blown.

* * * * *